(12) United States Patent
Ohkoshi et al.

(10) Patent No.: US 8,646,332 B2
(45) Date of Patent: Feb. 11, 2014

(54) INERTIA FORCE SENSOR

(75) Inventors: Hideo Ohkoshi, Osaka (JP); Tomohiro Mitani, Fukui (JP)

(73) Assignee: Panasonic Corporation, Osaka (JP)

( * ) Notice: Subject to any disclaimer, the term of this patent is extended or adjusted under 35 U.S.C. 154(b) by 403 days.

(21) Appl. No.: 12/673,870

(22) PCT Filed: Aug. 29, 2008

(86) PCT No.: PCT/JP2008/002359
§ 371 (c)(1),
(2), (4) Date: Feb. 17, 2010

(87) PCT Pub. No.: WO2009/031285
PCT Pub. Date: Mar. 12, 2009

(65) Prior Publication Data
US 2011/0036167 A1    Feb. 17, 2011

(30) Foreign Application Priority Data
Sep. 3, 2007  (JP) ................. 2007-227742

(51) Int. Cl.
G01C 19/56  (2012.01)
(52) U.S. Cl.
USPC ..................... 73/504.04; 73/504.12
(58) Field of Classification Search
USPC ........................ 73/504.04, 504.12
See application file for complete search history.

(56) References Cited

U.S. PATENT DOCUMENTS

| | | | |
|---|---|---|---|
| 6,007,668 A * | 12/1999 | Kodani et al. | 156/295 |
| 6,400,044 B1 | 6/2002 | Lohberg et al. | |
| 7,084,009 B2 * | 8/2006 | Sunohara et al. | 438/112 |
| 2004/0188857 A1 * | 9/2004 | Ohnishi et al. | 257/778 |
| 2004/0200279 A1 * | 10/2004 | Mitani et al. | 73/504.03 |
| 2004/0209399 A1 | 10/2004 | Sunohara et al. | |
| 2005/0066724 A1 | 3/2005 | Hiraoka et al. | |
| 2006/0049497 A1 | 3/2006 | Ohta | |
| 2007/0044558 A1 | 3/2007 | Ohta | |
| 2009/0100929 A1 | 4/2009 | Ohkoshi | |
| 2010/0089155 A1 | 4/2010 | Sugihara et al. | |
| 2010/0328832 A1 | 12/2010 | Hasunuma et al. | |

FOREIGN PATENT DOCUMENTS

| | | |
|---|---|---|
| JP | 2001-004379 A | 1/2001 |
| JP | 2002-071353 A | 3/2002 |
| JP | 2002-530684 A | 9/2002 |
| JP | 2004-028913 A | 1/2004 |
| JP | 2004-271479 A | 9/2004 |
| JP | 2005-106584 A | 4/2005 |

(Continued)

OTHER PUBLICATIONS

Chinese Office Action dated Apr. 13, 2011.

(Continued)

Primary Examiner — Hezron E Williams
Assistant Examiner — Gregory J Redmann
(74) Attorney, Agent, or Firm — Pearne & Gordon LLP

(57) ABSTRACT

An inertial sensor includes oscillating-type angular velocity sensing element, IC for processing signals supplied from angular velocity sensing element, capacitor for processing signals, and package for accommodating angular velocity sensing element, IC, capacitor. Element and IC are housed in package via a vibration isolator, which is formed of TAB tape, plate on which IC is placed, where angular velocity sensing element is layered on IC, and outer frame placed outside and separately from plate and yet coupled to plate via wiring pattern.

21 Claims, 7 Drawing Sheets

(56) References Cited

FOREIGN PATENT DOCUMENTS

| | | |
|---|---|---|
| JP | 2006-78248 A | 3/2006 |
| JP | 2006-194681 A | 7/2006 |
| JP | 2007-40766 A | 2/2007 |
| JP | 2007-064753 A | 3/2007 |
| WO | 03/046479 A1 | 6/2003 |
| WO | 2006/132277 A1 | 12/2006 |
| WO | 2007/015418 A1 | 2/2007 |

OTHER PUBLICATIONS

International Search Report for PCT/JP2008/002359.

English Abstract and Machine Translation of JP 2004-028913 A, previously cited in an IDS dated Feb. 17, 2010.

Machine Translation of JP 2004-028913A, previously filed in IDS dated Feb. 17, 2010.

* cited by examiner

PRIOR ART

INERTIA FORCE SENSOR

TECHNICAL FIELD

The present invention relates to inertial sensors to be used in various electronic devices for posture control or navigation of mobile units such as aircraft, automobiles, robots, ships, and vehicles.

BACKGROUND ART

FIG. 9 shows an exploded perspective view of a conventional angular velocity sensor. FIG. 10 shows a sectional view of the conventional angular velocity sensor. As shown in FIG. 9 and FIG. 10, the conventional angular velocity sensor comprises the following structural elements:
- oscillating-type angular velocity sensing element 2 formed of an oscillator shaped like a tuning-fork;
- IC 4 for processing signals supplied from angular velocity sensing element 2, and
- capacitor 6 for processing signals.

Sensing element 2, IC 4 and capacitor 6 are arranged and mounted in housing 8. Housing 8 closed with lid 10 is accommodated in package 12, and is protected by cover 14.

Plate 16 is formed inside package 12 for receiving housing 8 thereon. Plate 16 is coupled to package 12 via terminals 18 having bends each shaped like letter "S". Terminal 18, angular velocity sensing element 2, and IC 4 are coupled to one another via electrode pads 20 placed in housing 8, and signals are input or output via terminals 18.

The foregoing angular velocity sensor is mounted corresponding to a target shaft to be sensed, whereby the sensor is used for a posture controller or a navigation device of mobile units such as vehicles. In the structure discussed above, plate 16 on which housing 8 is placed is coupled to package 12 via terminals 18 each of which has a bend shaped like a letter "S". This structure thus allows reducing disturbance vibrations caused by an impact and applied to the sensor. Patent Literature 1 is known as related art to the present invention.

Since angular velocity sensing element 2 and IC 4 are arranged in housing 8, they occupy a greater area in housing 8. Sensing element 2 is electrically coupled to terminal 18 via electrode pads 20 of housing 18, and IC 4 is also electrically coupled to terminal 18 via pads 20, so that housing 8 needs a large number of electrode pads 20. As a result, housing 8 resists being downsized.

Patent Literature 1: International Publication Number 03/046479 pamphlet.

DISCLOSURE OF INVENTION

The present invention aims to provide an inertial sensor which features damping disturbance vibrations, reducing an area for mounting an angular velocity sensing element and an IC, reducing the number of electrode pads to be used for inputting/outputting signals, and being downsized.

A vibration isolator of the inertial sensor of the present invention is formed of a plate, on which an IC is mounted, where an angular velocity sensing elements is layered on the IC, and an outer frame placed outside and spaced from the plate and yet coupled to the plate via wiring patterns. The plate is held in midair by the wiring patterns and mounted to a package via the outer frame. The angular velocity element or the IC is electrically coupled to the wiring patterns.

Since the angular velocity sensing element is layered on the IC, the mounting area on the plate occupied by the sensing element can be reduced, and yet, the plate is held in midair by the wiring patterns and, via the outer frame, coupled to the package linked to the plate. The wiring patterns thus work as a vibration isolator for absorbing the disturbance vibrations.

Since the angular velocity element is electrically coupled to the wiring patterns, and the IC is also electrically coupled to the wiring patterns, the number of electrical joints can be reduced, which results in downsizing the sensor.

On top of that, a reliably mountable area can be obtained on the IC, and each one of the wiring patterns is loaded with a greater mass, so that the wiring patterns can absorb the greater amount of vibrations. In other words, the present invention allows the inertial sensor to damp the disturbance vibrations and to be downsized without lowering the sensing accuracy.

Figure 1:
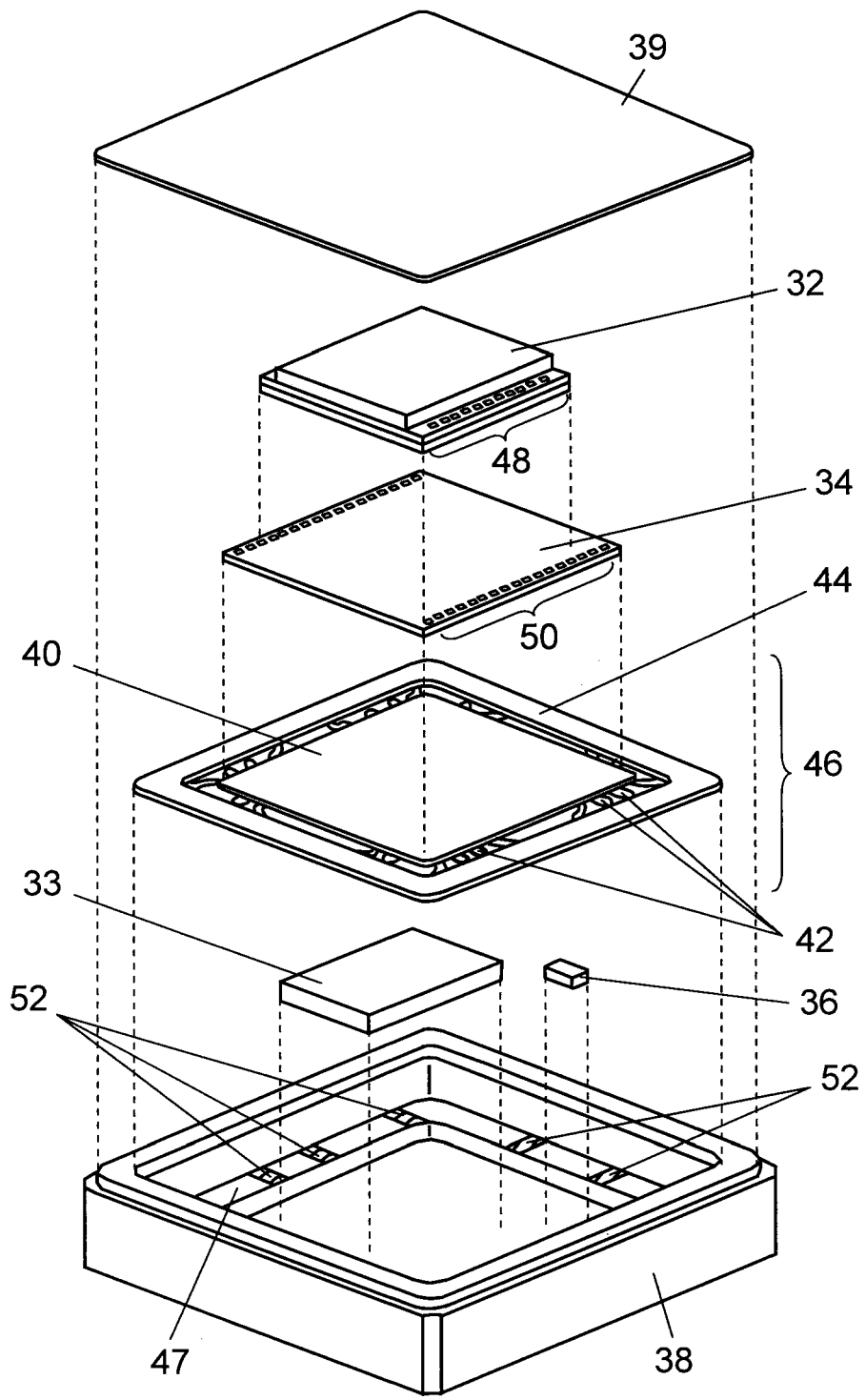
FIG. 1 shows an exploded perspective view of an angular velocity sensor in accordance with a first embodiment of the present invention.

DESCRIPTION OF REFERENCE SIGNS 32, 61 angular velocity sensing element
33, 55, 66, 71 acceleration sensing section
34, 67 IC
36 capacitor
38, 68 package
40, 63 plate
42, 64 wiring pattern
44, 65 outer frame
46 TAB tape
47 step
48 electrode pad for element
50 electrode pad for IC
52 electrode pad for connection
54 bonding wire
62 vibration isolator

BEST MODE FOR CARRYING OUT THE INVENTION

Embodiment 1

Figure 2:
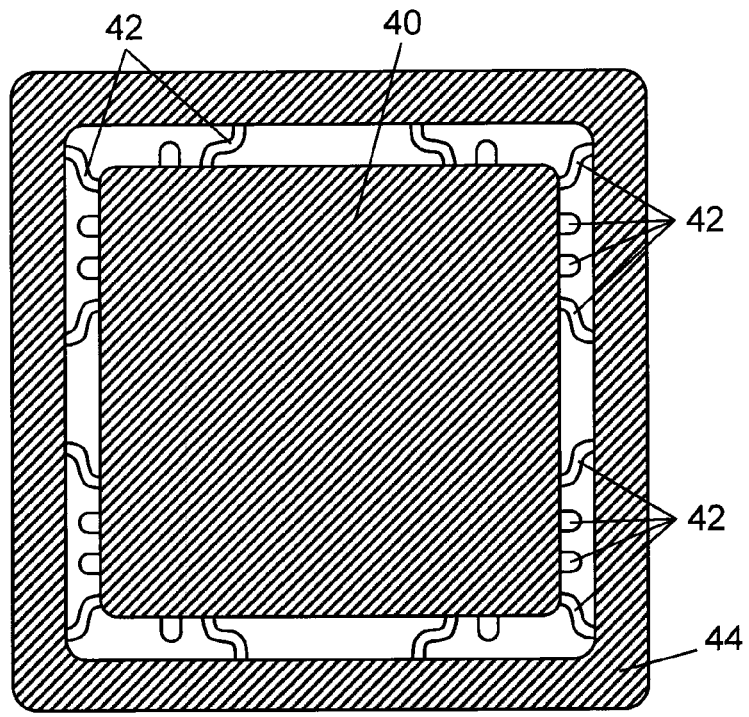
FIG. 2 shows a plan view of a vibration isolator of the angular velocity sensor in accordance with the first embodiment of the present invention.
Figure 3:
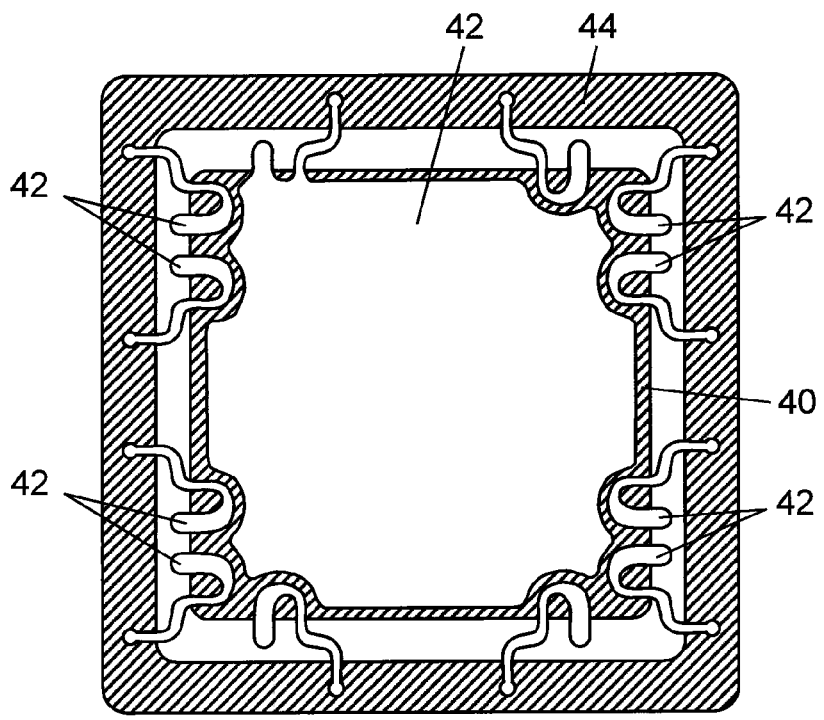
FIG. 3 shows a bottom view of the vibration isolator of the angular velocity sensor in accordance with the first embodiment of the present invention.
Figure 4:
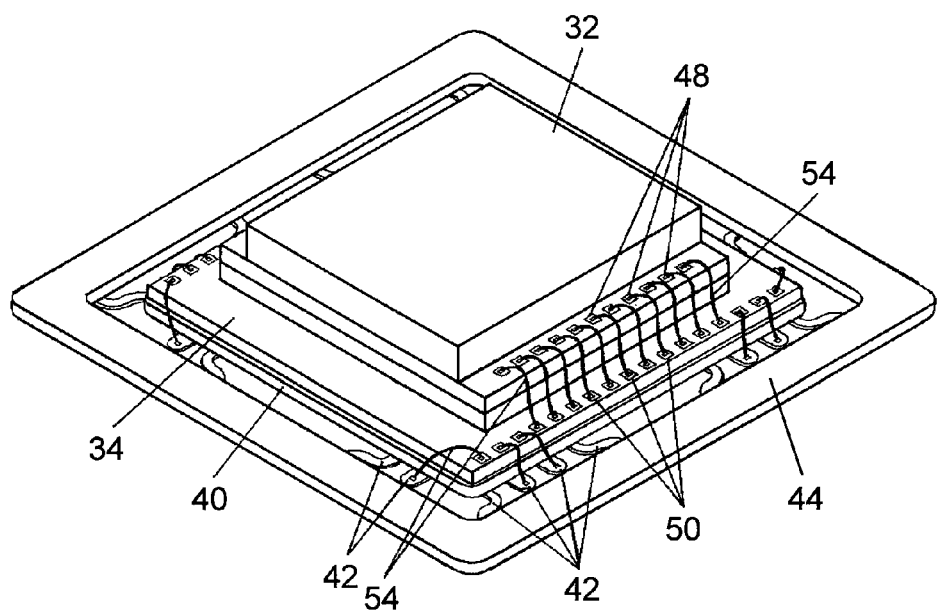
FIG. 4 shows a perspective view of the angular velocity sensor, not yet accommodated in a housing, in accordance with the first embodiment of the present invention.

FIG. 1 shows an exploded perspective view of an angular velocity sensor in accordance with the first embodiment of the present invention. FIG. 2 shows a plan view of a vibration isolator of the angular velocity sensor in accordance with the first embodiment. FIG. 3 shows a bottom view of the vibration isolator of the angular velocity sensor in accordance with the first embodiment. FIG. 4 shows a perspective view of the angular velocity sensor, not yet accommodated in a housing, in accordance with the first embodiment.

As shown in FIG. 1-FIG. 4, the angular velocity sensor comprises the following structural elements:
- oscillating-type angular velocity sensing element 32 formed of an oscillator shaped like a tuning-fork;
- acceleration sensing section 33 formed of an acceleration sensor;
- IC 34 for processing signals supplied from angular velocity sensing element 32 and acceleration sensing section 33;
- capacitor 36 for processing signals;
- package 38; and
- lid 39.

Package 38 and lid 39 accommodate angular velocity sensing element 32, acceleration sensing section 33, IC 34, and capacitor 36. Angular velocity sensing element 32 and IC 34 are accommodated in package 38 via a vibration isolator. Acceleration sensing section 33 is placed on the inner bottom face of package 38.

The vibration isolator is formed of TAB (Tape Automated Bonding) tape 46 which comprises the following elements:
- plate 40 on which IC 34 is placed, where angular velocity sensing element 32 is layered on IC 34; and
- outer frame 44.

Outer frame 44 is placed outside plate 40 and isolated from plate 40 although it is coupled to plate 40 via wiring patterns 42. Angular velocity sensing element 32 and IC 34 are placed on plate 40 such that the gravity center of angular velocity sensing element 32, that of IC 34, and that of plate 40 can be aligned on one axis.

Plate 40 and outer frame 44 are made of insulating film. Wiring patterns 42 are bonded to the insulating film such that they can be point-symmetric in shape and in position with respect to the center of plate 40. Outer frame 44 of TAB tape 46 is situated on step 47 provided on the bottom face of package 38, so that plate 40 is held in midair. "Holding in midair" refers to as the vibration isolator is mounted to step 47 while it is spaced away from the bottom of package 38. Capacitor 36, of which height is smaller than that of step 47, is placed by using this space.

Angular velocity sensing element 32 includes element electrode-pads 48 working for inputting/outputting signals. IC 34 includes IC electrode-pads 50 working for inputting/outputting signals, and package 38 includes connecting electrode-pads 52 working for coupling to pads 48 or to pads 50. Pads 50 are placed outside sensing element 32, and are electrically coupled to pads 48 or wiring patterns 42. Element electrode-pads 48, IC electrode-pads 50, and wiring patterns 42 are coupled together electrically with bonding wires 54. Wiring patterns 42 are electrically coupled to pads 52. Signals are input or output via wiring patterns 42.

The foregoing angular velocity sensor is mounted, corresponding to a subject shaft to be sensed, to a posture controller or a navigation device of a movable unit such as a vehicle.

As discussed above, since angular velocity sensing element 32 is layered on IC 34, the mounting area on plate 40 can be reduced, so that the sensor can be downsized. On top of that, plate 40 is held in midair and coupled, via wiring patterns 42, to outer frame 44 which is mounted to package 38, so that wiring patterns 42 work as a vibration isolator for absorbing the disturbance vibrations. As a result, the structure discussed above allows the sensor to damp the disturbance vibrations and to be downsized with the sensing accuracy maintained.

Figure 5:
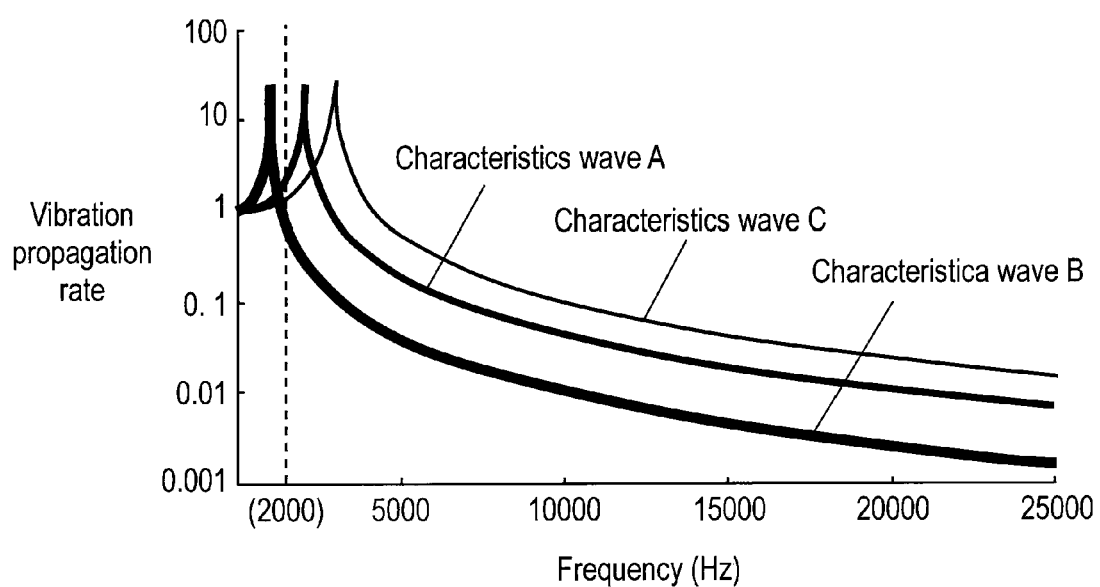
FIG. 5 shows attenuation characteristics which illustrate the relations between the frequencies of disturbance vibrations and vibration propagating rates.

FIG. 5 shows attenuation characteristics which illustrate the relations between the frequencies of disturbance vibrations and vibration propagating rates. In FIG. 5, assume that characteristics wave A is a reference attenuation-characteristics wave, and then the vibration propagating rate takes the maximum value along wave A when the frequency of the disturbance vibration arrives around 2000 Hz. The propagating rate lowers as the frequency rises higher. Along characteristics wave B, the propagation rate takes the maximum value at a lower frequency than along wave A. Along characteristics wave C, the rate takes the maximum value at a higher frequency than along wave A. Both of the propagation rates of waves B and C lower as the frequencies rise higher. Comparison of wave A with wave B reveals that wave B attenuates in greater amount than wave A in a higher frequency area than the disturbance vibrations frequency at which the propagation rates of wave A takes the maximum value. Comparison of wave A with wave C reveals that wave A attenuates in greater amount than wave C in a higher frequency area than the disturbance vibrations frequency at which the propagation rates of wave C takes the maximum value. The resonant vibration frequency is expressed with the following equation:

$$f = \alpha \sqrt{k/m} \quad (1)$$

where "f" is the resonant vibration frequency at which the propagation rate takes the maximum value, "α" is a coefficient, "k" is a spring constant produced by wiring patterns 42, and "m" is a total mass of the objects supported by outer frame 44 via wiring patterns 42. In this first embodiment, "m" chiefly represents the total mass of plate 40, angular velocity sensing element 32 and IC 34.

The inertial sensor (angular velocity sensor) of the first embodiment of the present invention has the following characteristics:
- angular velocity sensing element 32 has a vibration frequency of approx. 22000 Hz, and includes rigidity of "k" as well as a greater mass of "m" in order to obtain a waveform of excellent attenuation characteristics, such as characteristics waveform B, on the higher frequency side.

To be more specific, the total mass (m) of the objects supported by outer frame 44 via wiring patterns 42 is increased by layering angular velocity sensing element 32 onto IC 34, so that the disturbance vibrations at the higher frequency side can be absorbed in greater amount. While angular velocity sensing element 32 vibrates at around 22000 Hz, a disturbance vibration, of which frequency is similar to this vibration frequency, applied to element 32 can be efficiently attenuated by the structure discussed above for reducing the adverse effect of the disturbance vibration to the vibration of angular velocity sensing element 32.

Since the gravity center of element 32, that of IC 34, and that of plate 40 are aligned on one axis, a uniform mass is applied to wiring patterns 42 with respect to the center, i.e. the gravity center of plate 40. Angular velocity sensing element 32 thus can be steadily placed on plate 40, so that element 32 can be prevented from degrading its sensitivity.

In the case where the gravity center of plate 40 and that of IC 34 are misaligned from the one axis or the gravity center of plate 40 and that of angular velocity sensing element 32 are misaligned from the one axis due to, e.g. external force acting on the sensor, the moment caused by the misalignment acts on plate 40. Element 32 then cannot be placed steadily on plate 40, thereby sometimes adversely affecting the sensitivity of element 32. The foregoing alignment of the gravity centers of element 32, IC 34, and plate 40 on the one axis includes that the gravity centers thereof are aligned substantially on the one axis.

Since angular velocity sensing element 32 is layered on IC 34, element 32 can be steadily mounted onto IC 34 even when element 32 is miniaturized. Oscillating-type angular velocity sensing element 32 includes an oscillating section to oscillate and a fixing section to mount itself fixedly. The area of the fixing section, which does not oscillate, takes a rather smaller part of the total area of element 32, so that this fixing section is placed on IC 34 for mounting element 32 to IC 34, whereby the stability of element 32 can be increased and the degradation in the characteristics thereof can be prevented.

Angular velocity sensing element 32 is electrically coupled to wiring patterns 42 with bonding wires 54 as well as IC 34 is electrically coupled to wiring patterns 42 with bonding wires 54, so that the number of electrical joints in package 38 can be reduced. As a result, the sensor can be downsized.

On top of that, angular velocity sensing element 32 is placed on IC 34 for obtaining more stability, and the IC electrode-pads are placed outside the element 32. IC 34 is placed on plate 40 which works as a part of the vibration isolator, and wiring patterns 42 are placed outside the IC 34. This structure allows coupling the element electrode-pads 48 to the IC electrode-pads electrically as the need arises, so that all of the element electrode-pads 48 or all of the IC electrode-pads 50 are not necessarily electrically coupled to connection electrode-pads 52 placed inside the package 38. In other words, a reduction in the number of connection electrode-pads 52 still allows electrical connections between element electrode-pads 48, IC electrode-pads 50, or wiring patterns 42 and connection electrode-pads 52. As a result, the number of electrode pads working for inputting/outputting signals can be reduced, thereby downsizing the sensor.

Plate 40 and outer frame 44 are made of insulating film, and use of TAB tape 46, formed by bonding the wiring patterns 42 to the insulating film, allows forming the vibration isolator with ease.

Wiring patterns 42 can be point-symmetric with respect to the center of plate 40, or line-symmetric with respect to the centerline extending through the center of plate 40. This structure prevents plate 40 from lowering the absorption rate of the disturbance vibrations along a specific direction. When wiring patterns 42 form point-symmetric shapes with respect to the center of plate 40 at least in the portions between plate 40 and outer frame 44, an advantage similar to what is discussed above can be produced.

Figure 6:
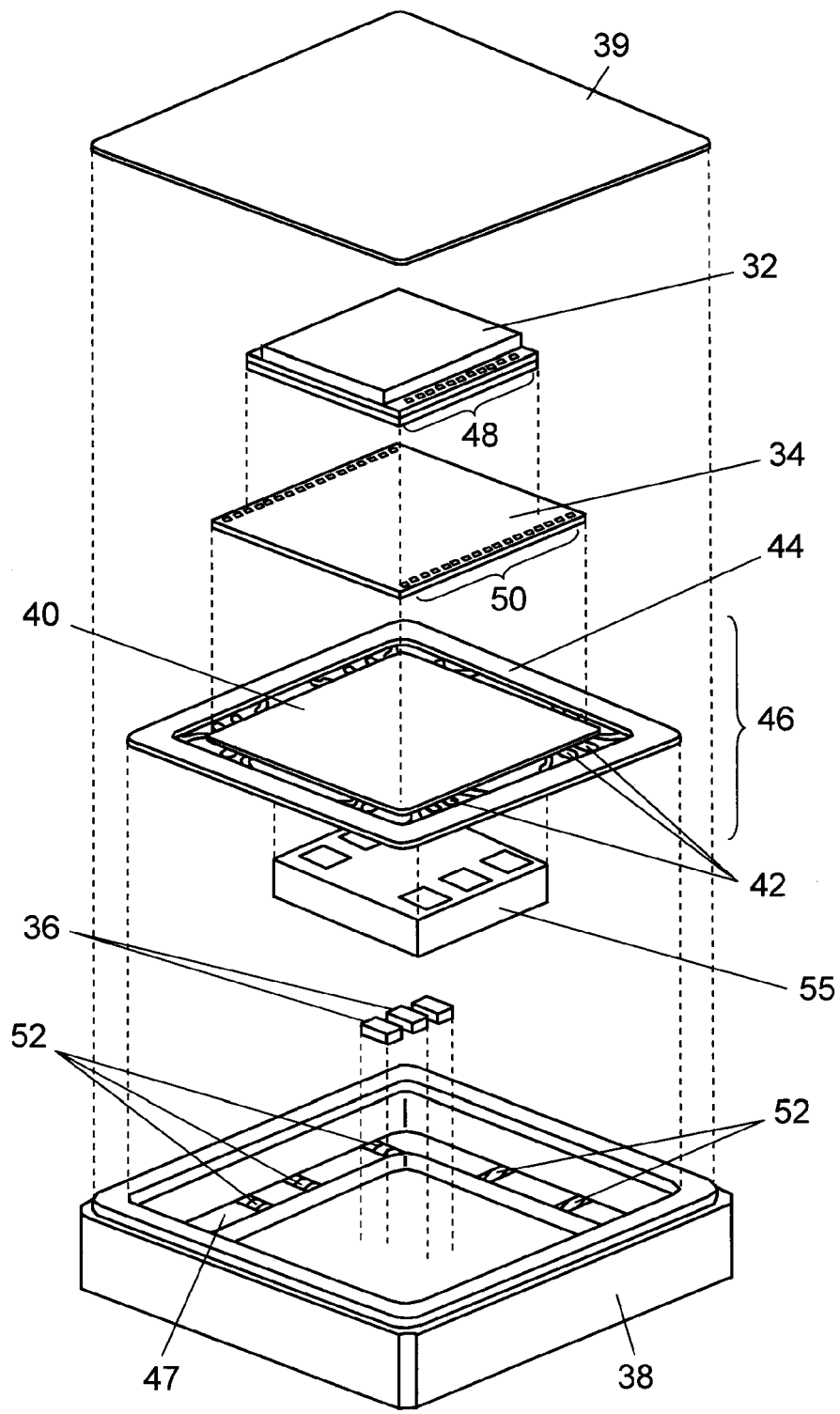
FIG. 6 shows an exploded perspective view of another angular velocity sensor in accordance with the first embodiment of the present invention.

FIG. 6 shows an exploded perspective view of another angular velocity sensor in accordance with the first embodiment of the present invention. Although FIG. 1 shows acceleration sensing section 33 placed on the inner bottom face of package 38, FIG. 6 shows acceleration sensing section 55 placed on the underside of plate 40 working as a part of the vibration isolator. The total mass of angular velocity sensing element 32 and IC 34 placed on the top face of plate 40 is made approximately equal to the mass of acceleration sensing section 55 placed on the underside of plate 40. This structure allows preventing an angular velocity different from the angular velocity to be sensed by angular velocity sensing element 32 from occurring caused by the deviation of the total gravity center of element 32, IC 34, plate 40 and acceleration sensing section 55. This structure also prevents another acceleration than the acceleration to be sensed by acceleration sensing section 55 from occurring. As a result, the accuracy of sensing signals of the angular velocity or the acceleration can be improved.

Embodiment 2

Figure 7:
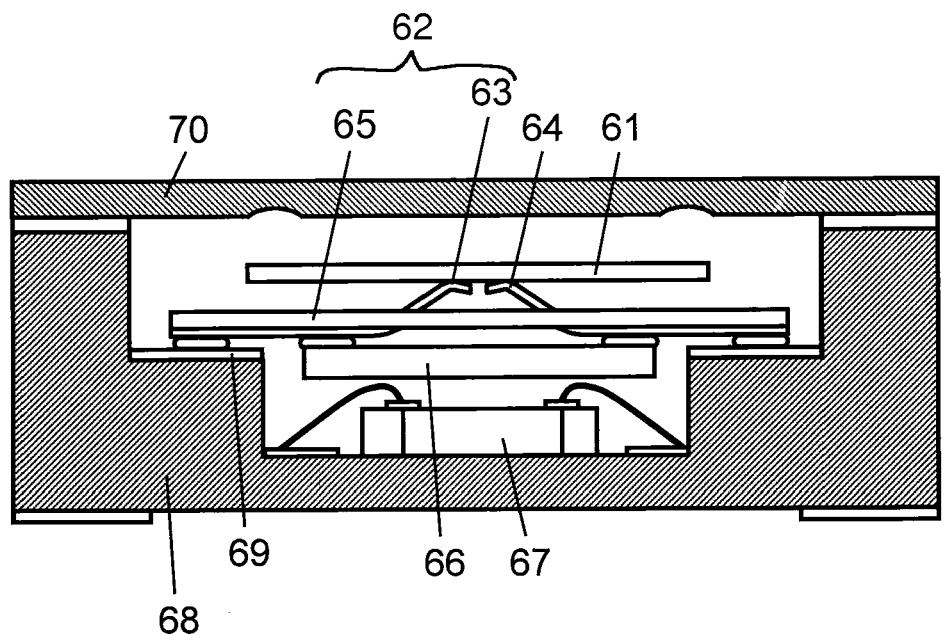
FIG. 7 shows a lateral sectional view of an angular velocity sensor in accordance with a second embodiment of the present invention.

FIG. 7 shows a lateral sectional view of an angular velocity sensor in accordance with a second embodiment of the present invention. In FIG. 7, vibration isolator 62 is formed of a plate 63 and outer frame 65 coupled to the plate 63 with wiring patterns 64. Angular velocity sensing element 61 is held in midair on the top face of the plate 63. Acceleration sensing section 66 formed of an acceleration sensor is placed on the underside of outer frame 65 working as a part of vibration isolator 62. IC 67 processes signals supplied from angular velocity sensing element 61 and acceleration sensing section 66. Package 68 includes step 69 to which outer frame 65 of vibration isolator 62 is fixed. IC 67 is placed on the inner bottom face of package 68. Lid 70 closes package 68.

The plate 63 of vibration isolator 62 is held in midair and mounted to package 68 by means of outer frame 65 coupled to the plate 63 via wiring patterns 64. Wiring patterns 64 thus work as the vibration isolator for absorbing the disturbance vibrations.

Figure 8:
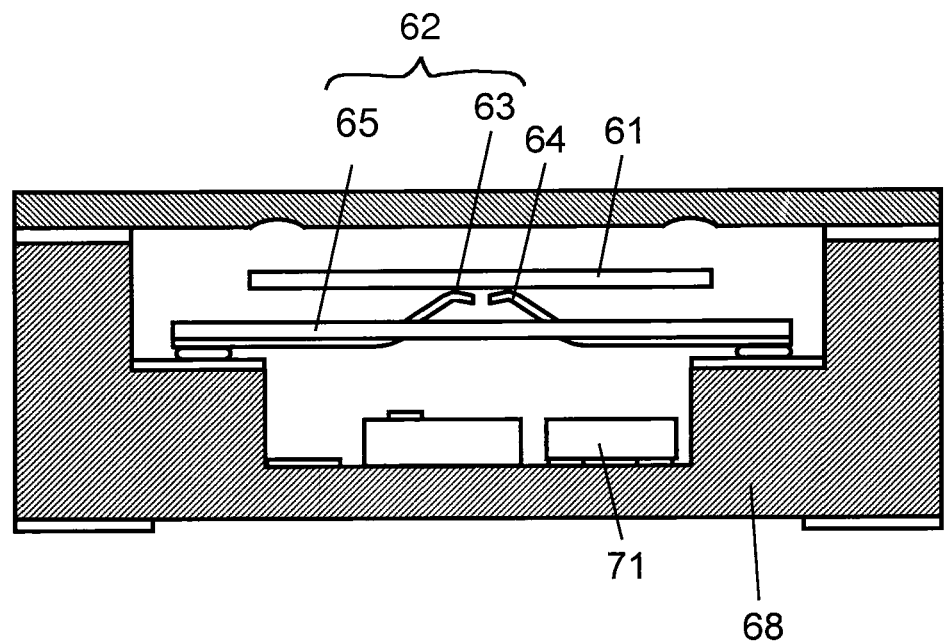
FIG. 8 shows an exploded perspective view of another angular velocity sensor in accordance with the second embodiment of the present invention.
Figure 9:
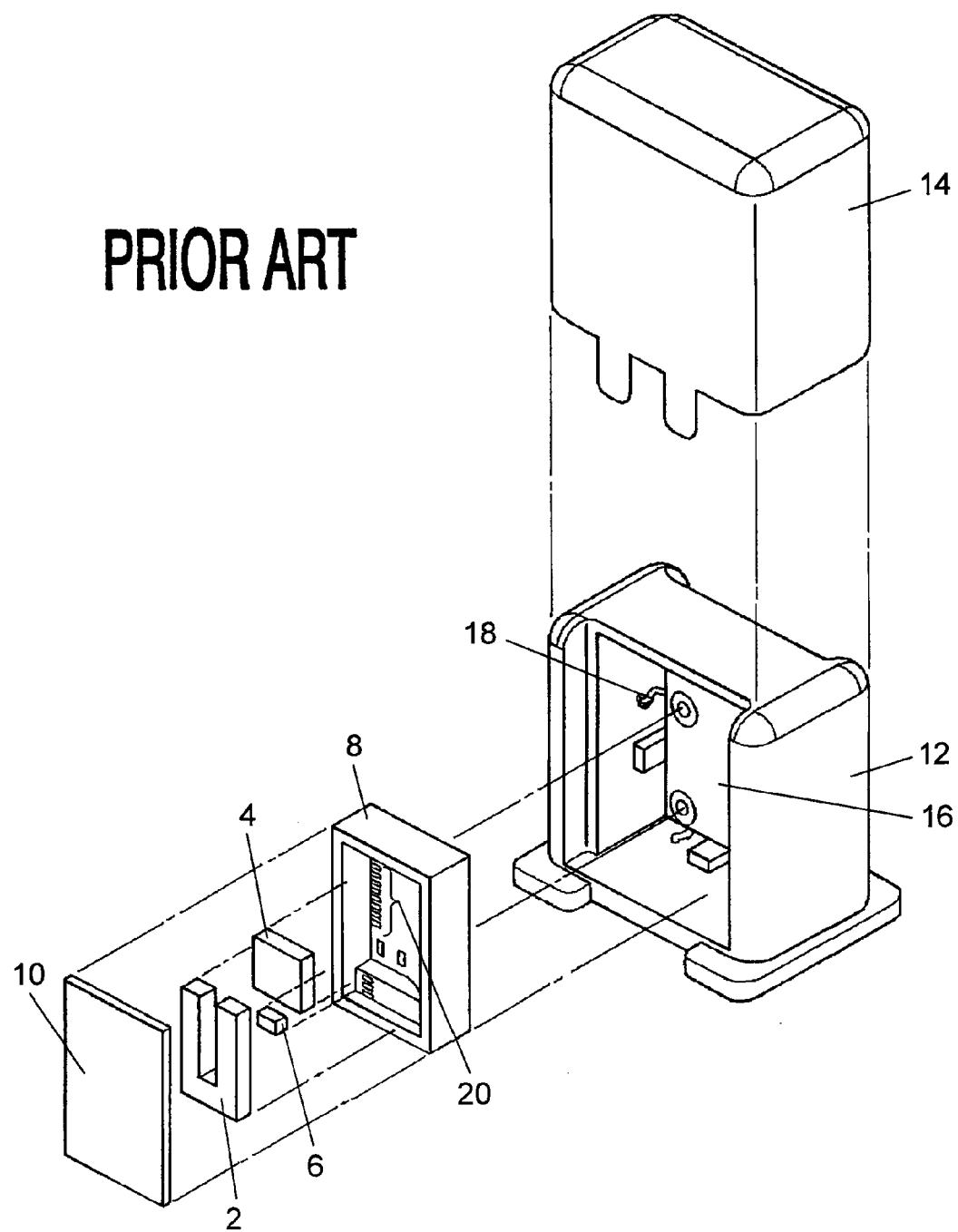
FIG. 9 shows an exploded perspective view of a conventional angular velocity sensor.
Figure 10:
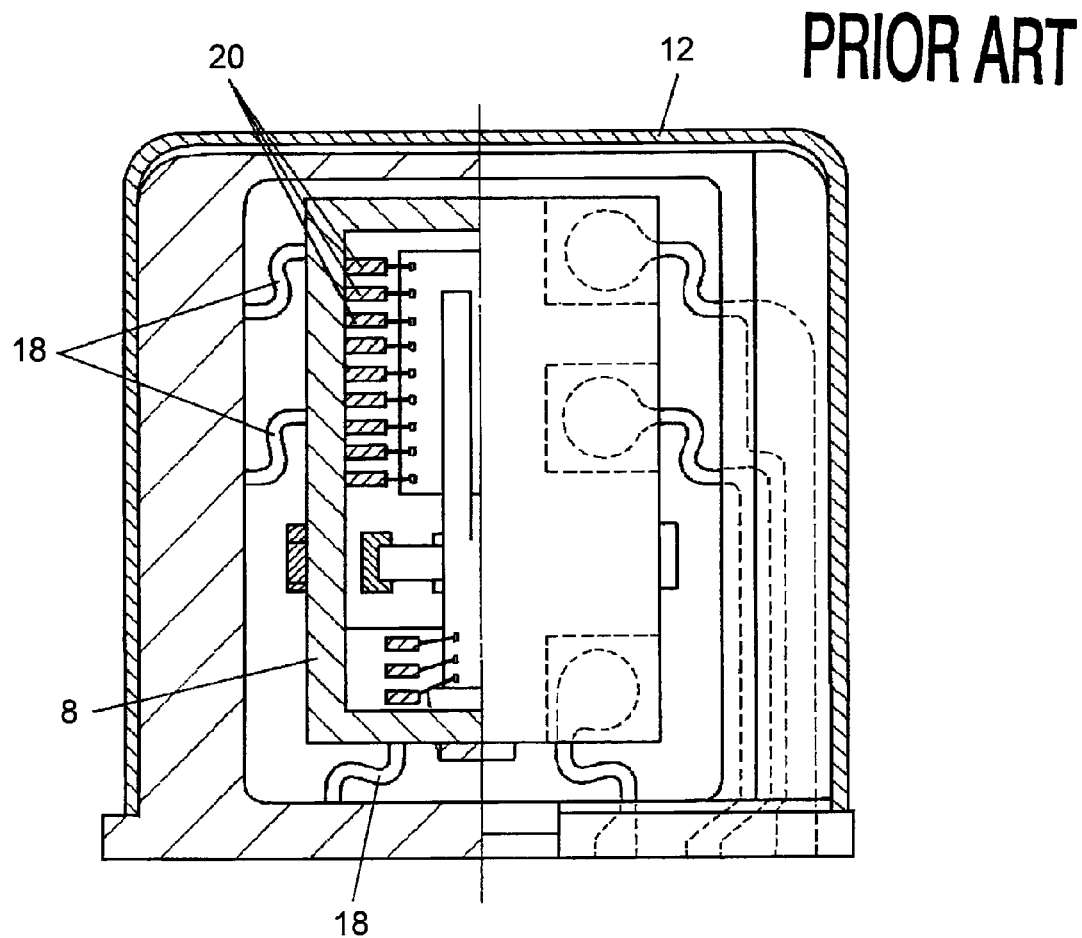
FIG. 10 shows a sectional view of the conventional angular velocity sensor.

FIG. 8 shows an exploded perspective view of another angular velocity sensor in accordance with the second embodiment of the present invention. Although FIG. 7 shows acceleration sensing section 66 placed on the underside of outer frame 66 of vibration isolator 62, FIG. 8 shows acceleration sensing section 71 placed on the inner bottom face of package 68. This structure also produces an advantage similar to what is discussed above.

INDUSTRIAL APPLICABILITY

The inertial sensor of the present invention reduces a surface mounting area of an angular velocity sensing element and an IC with disturbance vibrations suppressed, and yet, the inertial sensor allows reducing the number of electrode-pads working for inputting or outputting signals so that the sensor can be downsized. The inertial sensor thus can be used in a variety of electronic devices.

The invention claimed is:

1. An inertial sensor comprising:
   an angular velocity sensing element;
   an IC for processing signals supplied from the angular velocity sensing element;
   a vibration isolator; and
   a package for accommodating the angular velocity sensing element and the IC via the vibration isolator,
   wherein the vibration isolator includes:
      a plate, and
      an outer frame separately surrounding the plate, where the outer frame is coupled to the plate via a wiring pattern,
   wherein the plate, the IC, the angular velocity sensing element are stacked in this order.

2. The inertial sensor of claim 1, wherein a central axis of the angular velocity sensing element, a central axis of the IC, and a central axis of the plate are the substantially same axis.

3. The inertial sensor of claim 1, wherein the angular velocity sensing element includes an element electrode-pad working for input/output of signals, and the IC includes an IC electrode-pad working for input/output of signals, and the package includes a connection electrode-pad working for coupling itself to one of the element electrode-pad and the IC electrode-pad,
   wherein the IC electrode-pad is disposed outside the angular velocity sensing element,
   wherein one of the element electrode-pad and the IC electrode-pad is electrically coupled to the wiring pattern, wherein one of the element electrode-pad, IC electrode-pad and the wiring pattern is electrically coupled to the connection electrode-pad.

4. The inertial sensor of claim 3, wherein the element electrode-pad is connected to the IC electrode-pad and not connected to the wiring pattern and the connection electrode-pad.

5. The inertial sensor of claim 1, wherein a part of the wiring pattern which is outside a boundary of the plate is symmetric in shape with respect to a center of the plate.

6. The inertial sensor of claim 1, wherein at least a part of the plate is formed of TAB tape, and
the TAB tape is made of insulating film, and the wiring pattern is bonded to the insulating film.

7. The inertial sensor of claim 1, wherein the IC is placed on a first surface of the plate and a part of the wiring pattern is formed on a second surface of the plate which is opposite to the first surface.

8. The inertial sensor of claim 1, wherein a part of the wiring pattern electrically coupled to one of the angular velocity sensing element and the IC is disposed between the plate and the outer frame.

9. The inertial sensor of claim 1, further comprising:
an acceleration sensing section disposed in the package.

10. The inertial sensor of claim 9, wherein the IC is placed on a first surface of the plate and the acceleration sensing element is placed on a second surface of the plate which is opposite to the first surface.

11. The inertial sensor of claim 1, further comprising:
a capacitor disposed in the package.

12. The inertial sensor of claim 1, wherein the outer frame is coplanar to the plate.

13. The inertial sensor of claim 1, wherein the outer frame has an open rectangular shape.

14. The inertial sensor of claim 1, wherein the wiring pattern extends in a substantially planar direction of the vibration isolator.

15. The inertial sensor of claim 1, wherein the wiring pattern surrounds the plate in plan view.

16. The inertial sensor of claim 1, wherein a size of the angular velocity sensing element is smaller than a size of the IC in plan view.

17. A sensor comprising:
an inertial force sensing element;
an IC for processing signals supplied from the inertial force sensing element;
a member; and
a package for accommodating the inertial force sensing element, the member and the IC, wherein the member includes:
a plate, and
an outer frame separately surrounding the plate,
wherein the plate, the IC, the inertial force sensing element are stacked in this order.

18. The sensor of claim 17, wherein
the IC has first pads aligned at a first side of the IC and second pads aligned at a second side of the IC, the first side being opposite to the second side,
the outer frame has a third portion and a fourth portion,
wherein at least one of the first pads is electrically connected to the third portion via a first wire,
at least one of the second pads is electrically connected to the fourth portion via a second wire, and
an area of the inertial force sensing element is smaller than an area of the IC.

19. The sensor of claim 17, wherein
the IC has a third side perpendicular to the first side of the IC and a fourth side opposite to the third side, and
no pads are aligned in both of the third side and the fourth side of the IC.

20. The sensor of claim 17, wherein
the inertial force sensing element is an angular velocity sensing element and the outer frame is continuous frame.

21. The sensor of claim 17, wherein
the inertial force sensing element is an angular velocity sensing element.

* * * * *